(12) United States Patent
Cabral, Jr. et al.

(10) Patent No.: US 6,448,131 B1
(45) Date of Patent: Sep. 10, 2002

(54) METHOD FOR INCREASING THE CAPACITANCE OF A TRENCH CAPACITOR

(75) Inventors: Cyril Cabral, Jr., Ossining; Kevin K. Chan, Staten Island; Guy M. Cohen, Mohegan Lake; Ramachandra Divakaruni, Somers; Christian Lavoie; Fenton R. McFeely, both of Ossining, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/929,182

(22) Filed: Aug. 14, 2001

(51) Int. Cl.[7] ........................................... H01L 21/8242
(52) U.S. Cl. ..................... 438/243; 438/386; 438/964
(58) Field of Search ................................ 438/243, 249, 438/386, 392, 398, 255, 964; 257/309

(56) References Cited

U.S. PATENT DOCUMENTS

| | | | | |
|---|---|---|---|---|
| 5,106,776 A | * | 4/1992 | Shen et al. .................. | 438/242 |
| 5,182,232 A | * | 1/1993 | Chhabra et al. ... | 148/DIG. 138 |
| 5,223,081 A | * | 6/1993 | Doan .......................... | 438/386 |
| 5,972,804 A | * | 10/1999 | Tobin et al. ................. | 438/287 |
| 5,981,350 A | * | 11/1999 | Geusic et al. ............... | 438/243 |
| 6,008,104 A | * | 12/1999 | Schrems ...................... | 438/243 |
| 6,136,655 A | * | 10/2000 | Assaderaghi et al. ....... | 438/289 |
| 6,211,033 B1 | * | 4/2001 | Sandhu et al. .............. | 438/244 |

OTHER PUBLICATIONS

U.S. patent application Ser. No. 09/607,594, Narayanaswami, filed Jun. 30, 2000.
U.S. patent application Ser. No. 09/559,884, Akatsu et al., filed Apr. 26, 2000.
K.S Tang, et al., "Trends in Dram Electronics", Circuits and Devices, pp. 27–34 (May 1997).

* cited by examiner

*Primary Examiner*—Richard Booth
*Assistant Examiner*—Jennifer M. Kennedy
(74) *Attorney, Agent, or Firm*—Scully, Scott, Murphy & Presser; Marian Underweiser (57) ABSTRACT

A method for increasing the trench capacitor surface area is provided. The method, which utilizes a metal silicide to roughen the trench walls, increases capacitance due to the increase in the trench surface area after the silicide has been removed. The roughening of the trench walls can be controlled by varying one or more of the following parameters: the density of the metal, the metal film thickness, the silicide phase, and the choice of the metal. Once the metal is deposited in the trench, the method is self-limited. Shrinking the trench to its original width can be obtained by subsequent silicon deposition or by diffusion of silicon from a cap layer through the silicide.

38 Claims, 11 Drawing Sheets

METHOD FOR INCREASING THE CAPACITANCE OF A TRENCH CAPACITOR

FIELD OF THE INVENTION

The present invention relates to semiconductor devices, and more particularly to a semiconductor integrated circuit (IC) which includes at least one memory cell having a trench capacitor in which the trench walls have been roughened for enhanced capacitance using a metal silicide such as $CoSi_2$ as a roughening agent.

BACKGROUND OF THE INVENTION

A dynamic memory cell in an IC comprises a transistor and an associated capacitor. The capacitor consists of a pair of conductive plates, i.e., electrodes, which are separated from each other by a node dielectric material. Information or data is stored in the memory cell in the form of charge accumulated on the capacitor. As the density of the ICs with memory cells is increased, the area for the capacitor becomes smaller and the amount of charge the capacitor is able to accumulate is reduced. Thus, with less charge to detect, reading the information or data from the memory cell becomes much more difficult.

With a limited fixed space or volume for the capacitor of a memory cell in a highly integrated circuit, there are three known techniques for increasing the amount of charge within a fixed space or area. These three known techniques include: (1) decreasing the thickness of the dielectric material, i.e., node dielectric, that is located between the capacitor plates; (2) changing the dielectric material to one with a dielectric constant higher than $SiO_2$ or $Si_3N_4$; or (3) increasing the surface area of the space to be used for the capacitor. Note that it is possible to use a combination of (1) or (2) with (3).

Of the above-mentioned techniques, solution (3) is the most viable because the other two solutions have drawbacks associated therewith. For example, solution (1), which thins the capacitor dielectric, also increases leakage currents that may affect the memory retention performance of the capacitor and the reliability of the memory cell. Solution (2), which purports to change the dielectric material to a higher-dielectric constant material, will only cause a slight improvement in charge storage because the dielectric constant of suitable alternative dielectrics is only slightly higher than the dielectric material currently being used. Moreover, the substitution of alternative dielectrics may be more complicated, more expensive and provide fabrication problems that are heretofore unknown. Accordingly, solution (3), i.e., increasing the surface area of the space to be used for the capacitor, provides the most promise for substantially improving the amount of charge stored without causing any of the problems mentioned for solutions (1) and (2) above.

One previous solution to increase the surface area of the capacitor is to replace common stack capacitor technology with a trench capacitor. In common stack capacitor technology, the capacitor is built on a surface created on a semiconductor substrate. Whereas in trench capacitor technology, the capacitor is formed within a trench that is formed in a semiconductor substrate itself. An increase in depth of the trench, increases the surface area of the capacitor. However, the depth of the trench is limited by present fabrication methods and tools. This problem is further compounded by the continually increasing density of ICs achieved by dimensional shrinkage. To offset the loss of surface area due to a reduction in width, the depth of the trench must be further increased to the point where the necessary depth is not achievable or becomes prohibitively expensive.

Another prior art method to increase the surface area of the capacitor is to provide capacitor plates that contain textured or roughened surfaces in the deep trench adjacent to the dielectric material. A capacitor plate having roughened surface area increases the amount of surface area of the capacitor due to the peaks and valleys of the roughened surface. With this prior art structure and method, the depth of the trench is maximized and the rough surface of the plates is designed to give maximum surface area based on a cross-section of the roughened surface so that the surface area is three-dimensional at the interface of the plates and the dielectric material. However, this prior art method may result in microscopic roughness with sharp features or peaks on the order of a few Angstroms on the capacitor plate which may give rise to leakage through the dielectric material.

Co-assigned U.S. application Ser. No. 09/559,884, filed Apr. 26, 2000 provides a method of roughening the walls of a deep trench capacitor for increasing the charge storage capability of the trench without current leakage. In that application, oxidizable hemispherical silicon grains (HSG) are employed. When such material is employed in roughening the interior walls of the trench, residual polysilicon may remain on the trench walls therefore allowing current leakage to occur.

Co-assigned U.S. application Ser. No. 09/607,594, filed Jun. 30, 2001 discloses an alternative method of providing a deep trench having roughened trench sidewalls. In this prior disclosure, a discontinuous polysilicon layer is formed on the trench sidewalls instead of the HSG material disclosed above. The discontinuous polysilicon layer has gaps which expose a portion of the Si substrate such that during a subsequent oxidizing step an oxide material forms in the gaps which is smooth and wavy. The oxide material is then etched away so as to form smooth hemispherical grooves on the walls of the deep trench region.

Like the previous method, the discontinuous polysilicon material remains in the structure as a partially polycrystalline material even after the annealing step. Moreover, in both processes, gas phase doping is typically carried out to self-align the buried plate to the roughness before the capacitor dielectric is deposited. The doping profile, is not uniform and less aligned to the roughness in these prior art structures due to the rapid diffusion at the poly-crystalline grain boundaries and also due to the mixture of single and poly-silicon regions.

In view of the above-mentioned drawbacks, there is a need to develop a new and improved method of increasing the surface area of a trench capacitor without causing any substantial current leakage. Moreover, a method of increasing the surface area of a trench capacitor is needed in which the roughened trench walls consists of a single crystalline material; i.e., no polycrystalline material remains after roughening.

SUMMARY OF THE INVENTION

One object of the present invention is to provide a method of fabricating a trench for a capacitor in which the surface area of the trench has been increased.

Another object of the present invention is to provide a method of fabricating a trench for a capacitor in which the surface area of the trench is increased without causing any substantial current leakage through the cell.

A further object of the present invention is to provide a method of fabricating a trench for a capacitor in which the roughened trench walls consists of a single crystalline material.

An even further object of the present invention is to provide a method of fabricating a trench for a capacitor having an increased surface area without increasing the depth of the trench.

A yet further object of the present invention is to provide a method of fabricating a trench for a capacitor having increased surface area without increasing the lateral dimension of the trench.

These and other objects and advantages are achieved in the present invention by utilizing a method wherein the increased trench capacitor surface area is obtained by roughening the interior walls (sidewalls and bottom trench wall) of the trench using a metal silicide as a roughening agent.

Specifically, the method of the present invention comprises the steps of:

(a) forming a trench in a Si-containing substrate, said trench having an upper region, a lower region and interior walls including sidewalls which extend to a common bottom wall;

(b) forming a collar region in said upper region of said trench;

(c) forming a metal layer (lumpy or continuous and uniform) on at least a portion of exposed interior walls of said trench;

(d) annealing said metal layer so as to form a metal silicide layer; and (e) removing said metal silicide layer so as to provide roughened trench walls.

In one embodiment of the present invention, a Si-containing layer is formed atop the metal layer prior to annealing the same. This embodiment is used in circumstances wherein the trench cannot be increased laterally. The term "Si-containing layer" includes polysilicon, amorphous Si, SiGe, SiC, or epitaxial Si.

In yet another embodiment of the present invention, a Si-containing layer is formed on the metal silicide layer and thereafter an annealing step is performed which is capable of diffusing the Si-containing layer through the metal silicide layer and causing substantial recrystallization of the diffused Si-containing layer with the Si-containing substrate.

In an even further embodiment of the present invention, silicon germanium (SiGe) or other material that is capable of forming three-dimensional islands on the interior trench walls is formed prior to forming the metal layer (lumpy or continuous and uniform) in the trench.

It should be noted that in the present invention, annealing is typically carried out at a temperature of about 300° C. or above, with an annealing temperature from about 500° C. or above being more highly preferred. The exact annealing temperature employed will be dependent upon the desired silicide phase to be subsequently formed.

DETAILED DESCRIPTION OF THE INVENTION

The present invention, which employs a metal suicide layer as a means for roughening the interior walls of a trench, will now be described in more detail by referring to the drawings the accompany the present application. It is noted that in the accompanying drawings, like and/or corresponding elements are referred to by like reference numerals.

Figure 1A:
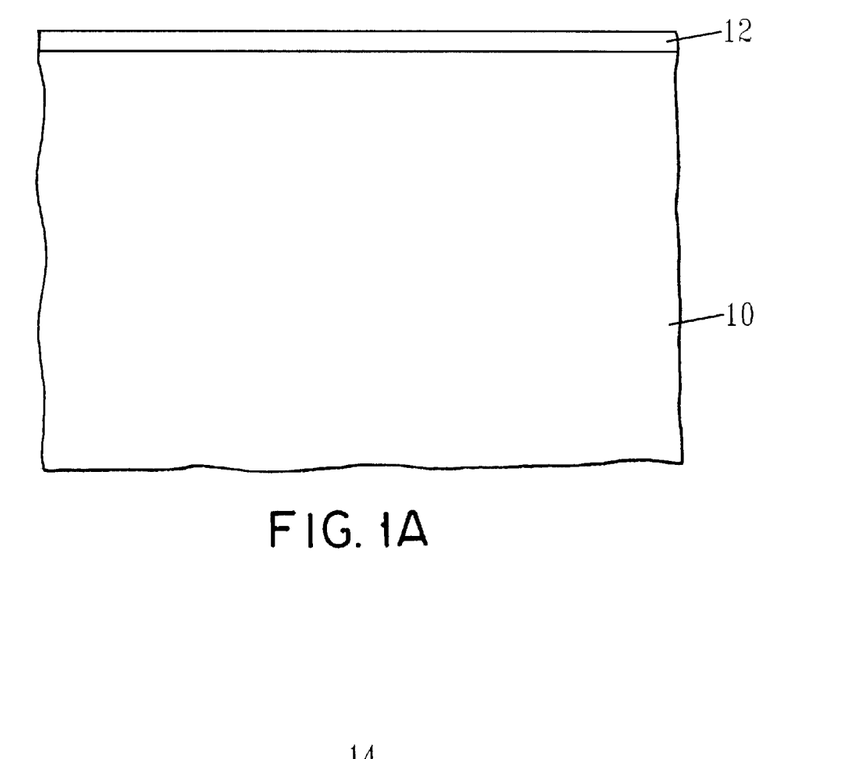
FIGS. 1A–1H are pictorial representations (through cross-sectional views) illustrating basic processing steps employed in the present invention in forming roughened trench sidewalls.

Reference is first made to FIGS. 1A–1H which illustrate the basic processing steps employed in the present invention for providing a trench for a capacitor element that contains roughened interior walls. The term "interior walls" includes sidewall portions which extend to a common bottom wall portion. FIG. 1A shows an initial structure that is employed in the present invention which comprises Si-containing substrate 10 having a hardmask 12 formed thereon.

The initial structure is formed utilizing conventional processes well known in the art and it is composed of conventional materials that are well known in the art. For example, Si-containing substrate 10 comprises any Si-containing semiconductor material including, but not limited to: Si, SiGe, SiGeC, SiC, Si/Si, Si/SiGe or silicon-on-insulators (SOIs). A highly preferred Si-containing substrate is a Si wafer or chip. The Si-containing substrate may be of the p or n-type depending upon the polarity of the final device to be fabricated.

It is noted that the Si-containing substrate may contain various active device regions and/or isolation regions such as shallow trench isolation (STI) regions or local oxidation of silicon (LOCOS) regions formed therein. For clarity, the drawings of the present invention do not specifically show the presence of the active device regions and/or isolation regions; however, reference numeral 10 is meant to include those regions.

Hardmask 12 is then formed on the surface of Si-containing substrate 10 utilizing a conventional deposition process such as chemical vapor deposition (CVD), plasma-assisted CVD, chemical solution deposition or evaporation. Alternatively, the hardmask may be formed by a thermal growing process such as oxidation, nitridation, oxynitridation or a combination thereof.

The hardmask may be composed of a single dielectric layer, or it may be composed of multiple dielectric layers wherein each of the dielectric layers has a different etch rate as compared with the previously formed dielectric layer. The hardmask may be comprised of an oxide, a nitride, an oxynitride or a stack including any combination of the aforementioned materials. In a preferred embodiment of the present invention, hardmask 12 is composed of an oxide, e.g., $SiO_2$, or a nitride, e.g., $Si_3N_4$.

The thickness of the hardmask is not critical to the present invention and it may vary depending on the type of dielectric material employed as well as the process used in forming the same. Typically, however, hardmask 12 has a thickness of from about 2 to about 1000 nm, with a thickness of from about 50 to about 100 nm being more highly preferred.

Figure 1B:
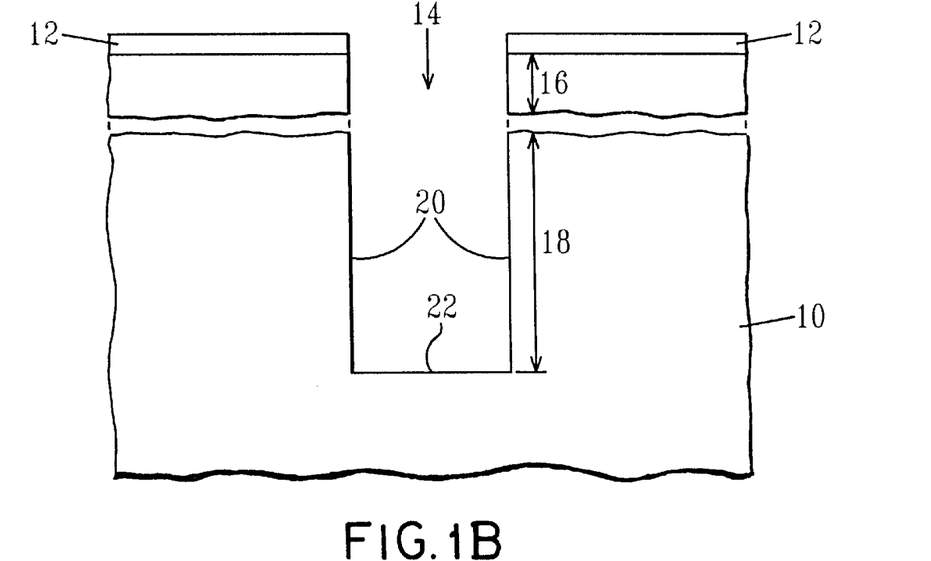

After forming hardmask 12 on a surface of the Si-containing substrate, one or more trench openings 14 (one of which is depicted in FIG. 1B) are formed through the hardmask and a portion of the Si-containing substrate. The one or more trench openings are formed utilizing conventional lithography and a dry etching process such as reactive-ion etching (RIE), ion beam etching, plasma etching or laser ablation.

Trench openings 14 include an upper region 16, a lower region 18 and interior walls which include sidewalls 20 that extend to common bottom wall 22. The depth of the trench openings, as determined from the top surface of Si-containing substrate 10 to bottom wall 22, may vary, but typically the depth of the one or more trench openings is from about 0.5 to about 20 $\mu$m below the top surface of Si-containing substrate 10, with a depth of from about 7 to about 10 $\mu$m being more highly preferred.

Figure 1C:
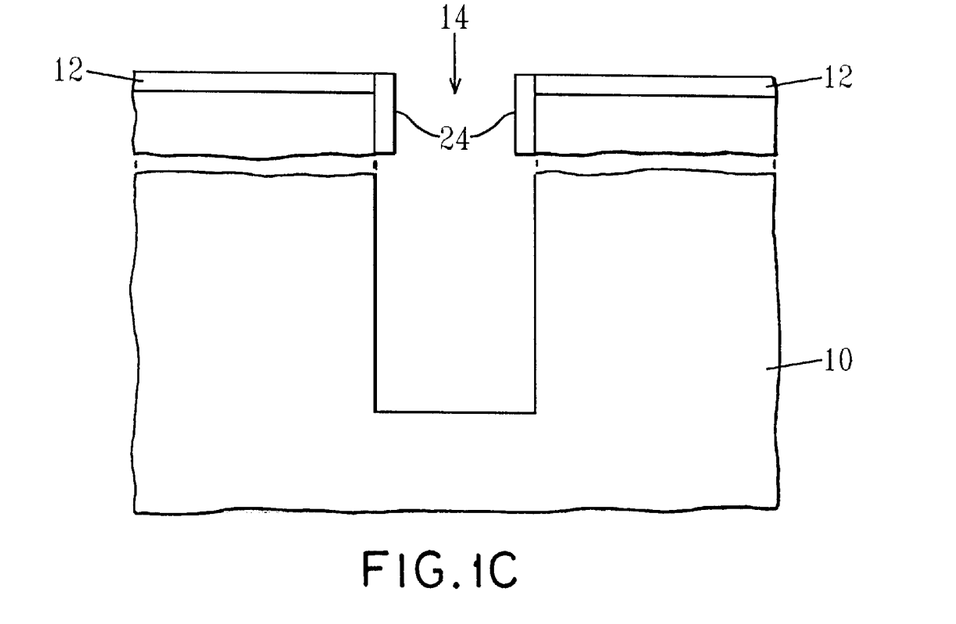

At this point of the present invention, and as shown in FIG. 1C, collar region 24 may be formed in upper region 16 of one or more trench openings 14. Collar region 24 may also be omitted in some embodiments of the present invention. When collar region 24 is present, it is formed utilizing conventional processing techniques well known in the art. For example, the collar region may be formed by deposition or thermally growing a collar material such as tetraethylorthosilicate (TEOS). In one embodiment of the present invention, the collar region may include an oxide collar having a nitride layer formed thereon.

Following the formation of the collar region, lower region 18 of trench opening 14 may be optionally subjected to an isotropic etching process which is capable of forming a trench which contains a broadened lower region that laterally extends outward from sidewalls 20. This embodiment of the present invention is not shown in the drawings, but is nevertheless contemplated herein.

In another optional, but highly preferred embodiment of the present invention, the interior walls of the trench opening may be treated with HF or another like chemical etchant which is capable of removing any native oxide that may be present on the trench walls as well as forming a trench wherein the 'cleaned' Si surface terminates with hydrogen.

Figure 1D:
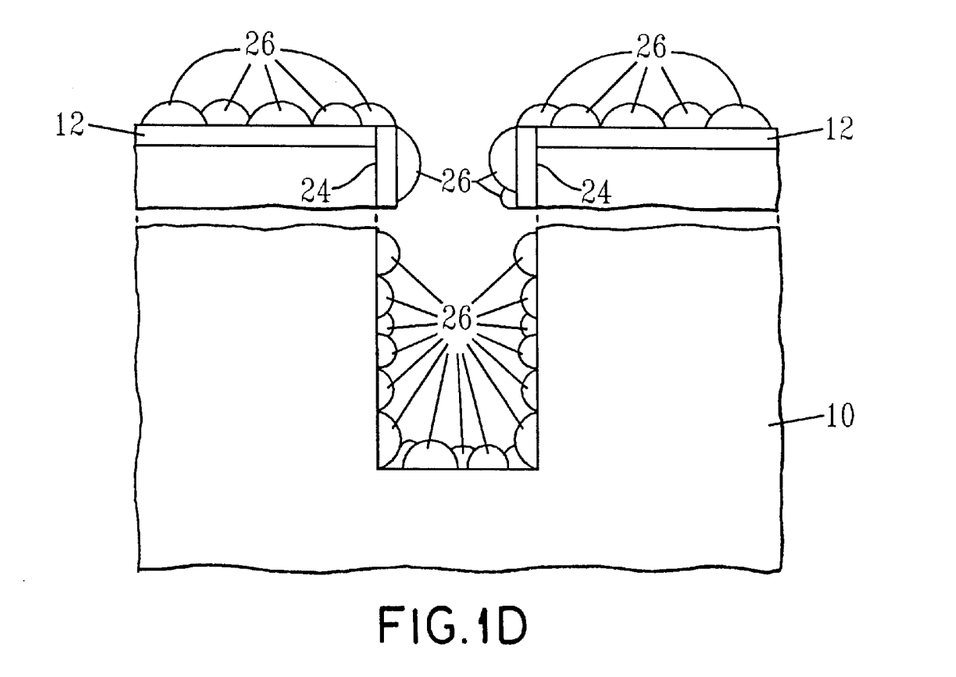

Next, and as illustrated in FIG. 1D, metal layer 26 is formed at least in lower region 18 of trench opening 14 on the interior trench walls including sidewalls 20 and bottom wall portion 22. Note that in the drawings, the metal layer is formed in the upper region on collar region 24 as well as hardmask 12. The metal layer formed at this point of the present invention may be a continuous and uniform layer, or the metal layer is comprised of islands, i.e., granules or lumps, that may or may not be in contact with neighboring islands.

Each metal island formed covers an area of from about 5×5 nm to about 2000×2000 nm and has a height of from about 5 to about 100 nm. More preferably, each island covers an area of about 20×20 nm and has a height of about 10 nm. Moreover, the islands have a density of from about $10^9$ to about $10^{15}$ cm$^{-2}$, with a density of from about $10^{10}$ to about $10^{12}$ cm$^{-2}$ being more highly preferred.

When a continuous and uniform metal layer is formed, the metal layer, regardless of the type of metal, has a thickness of from about 1 to about 200 nm. In the case of Co, the continuous and uniform Co layer has a thickness of from about 6 to about 9 nm.

The term "metal" is used herein to denote any elemental metal including alloys thereof that are capable of forming a metal silicide when annealed at temperatures of greater than 300° C.. Illustrative examples of such elemental metals include, but are not limited to: Ti, Co, Ni, W, Mo, Pt, Nb, Ta, V, Zr, Hf and mixtures thereof. As stated above, these elemental metals may be also used with an alloying element such as C, Al, Si, Sc, Ti, V, Ge, Cr, Mn, Fe, Ni, Cu, Y, Zr, Nb, Rh, In, Sn, La, Hf, Ta, W, Re, Pt, Ce Pr, Nd, Sm, Eu, Gd, Tb, Dy, Ho, Er, Tm, Yb, or any combination thereof, with the proviso that the alloying additive is not the same element as the metal.

When an alloy element is present, it is typically present in an amount of from about 0.01 to about 50 atomic percent. A highly preferred metal layer employed in the present invention is Co which does not necessarily include an alloy additive.

It should be noted that in embodiments wherein Ti is employed as the metal, it is possible to omit the removal of the native oxide film from the trench. This is because Ti is known to react with a thin oxide.

The metal layer is formed utilizing a selective or non-selective deposition process. In the case of selective deposition, the metal is deposited only over exposed Si-containing surfaces, i.e., on the exposed lower region of the least one trench opening. In the case of non-selective deposition, the metal is deposited everywhere, as shown in the drawings of the present application. Specifically, the metal layer may be formed by CVD, plasma-assisted CVD, plating, sputtering, evaporation, chemical solution deposition or any other like deposition process which is capable of forming an extremely high conformal metal layer within the trench. Without a highly conformal deposition process, it is difficult to deposit adequate metal in the deeper portions of the trench to effect the requisite surface area increase.

Figure 1E:
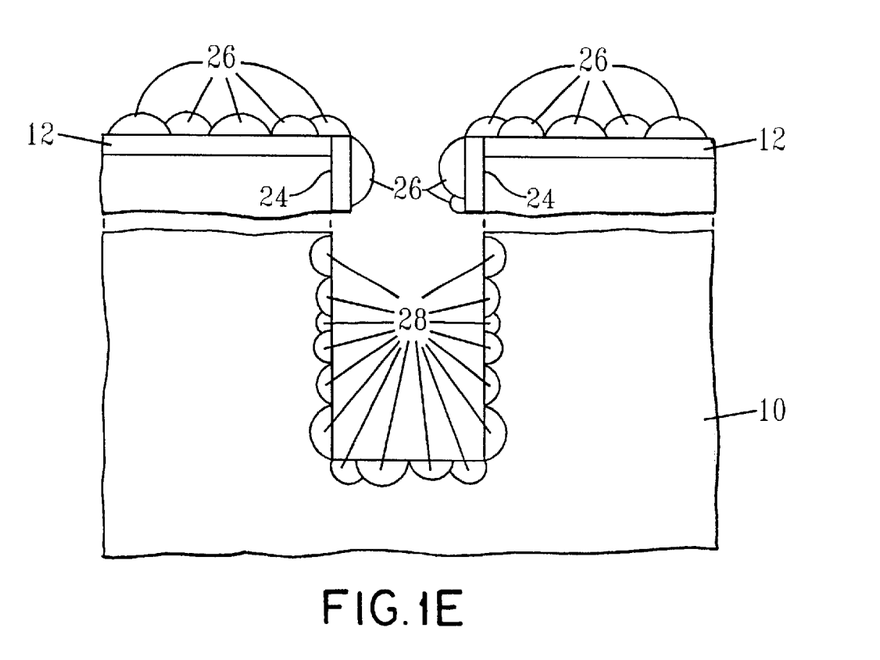

After deposition of the metal layer, the structure is then annealed under conditions which are capable of causing a reaction between Si-containing substrate 10 and metal layer 26 so that metal silicide layer 28 is formed, See FIG. 1E. Annealing is carried out in the present invention using a rapid thermal annealing (RTA) process. Typically, annealing is carried in a gas atmosphere such as He, Ar, $N_2$ or forming gas. Annealing may be carried out at a temperature of about 300° C. or above for a time period of about 300 seconds or less. In the case of forming $CoSi_2$, annealing is carried out a temperature of about 625° C. or above for a time period of about 120 second or less. The heating regime may be continuous or various ramp and soak cycles may be employed.

Note that in a preferred embodiment of the present invention, the annealing conditions are chosen such that a silicide phase which consumes a maximum amount of silicon is formed. Thus, it is possible to tune the roughening of the trench walls by selecting the specific type of silicide phase obtained during the annealing step. In the embodiment wherein Co is employed as the metal, annealing conditions of from about 625° to about 750° C. for a period of time of from about 30 to about 120 seconds are typically used in forming $CoSi_2$ which provides more roughening than the other phases of Co silicide.

Following the annealing step, any unreacted metal (including metal on the Si-containing substrate as well as hardmask and collar) is removed utilizing a conventional selective etching process that is well known in the art. Note that in some embodiments of the present invention the possibility exists that during the annealing step all of the metal is consumed within the trenches. This is typically the case on a production line since the annealing conditions are selected so as to consume all the metal formed on the interior walls of the trenches. In embodiments wherein the metal is not completely consumed inside the trenches, any wet etch process may be used in removing unreacted metal from the trench. The chemical etchant employed in the wet etch process is highly selective in removing unreacted metal as compared with either hardmask material, collar material, Si and silicide material. A suitable etchant that can be employed at this point of the present invention is a mixture of hydrogen peroxide and nitric or sulfuric acid. Other chemical etchants are also contemplated herein. Note that the wet etch process mentioned above also removes metal from atop the hardmask as well as the collar region.

Figure 1F:
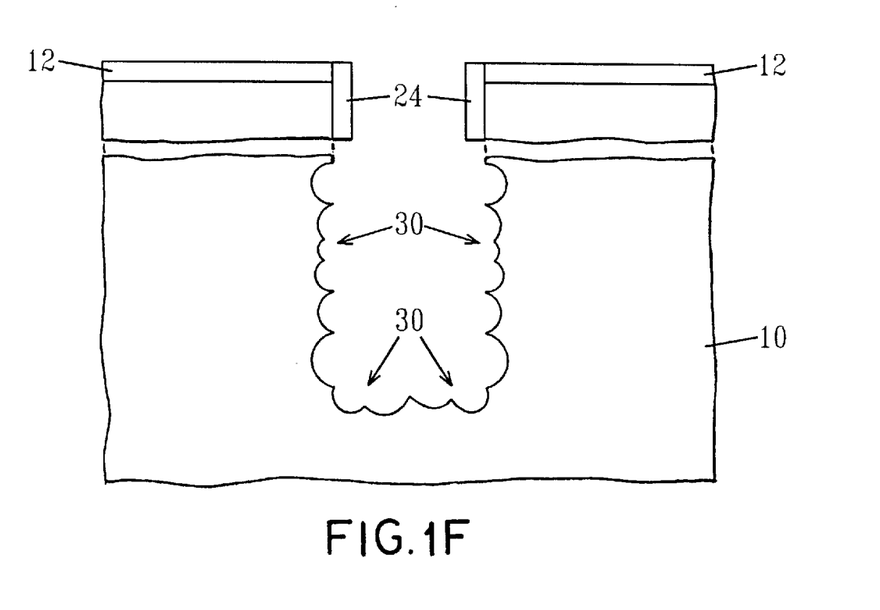
Figure 2A:
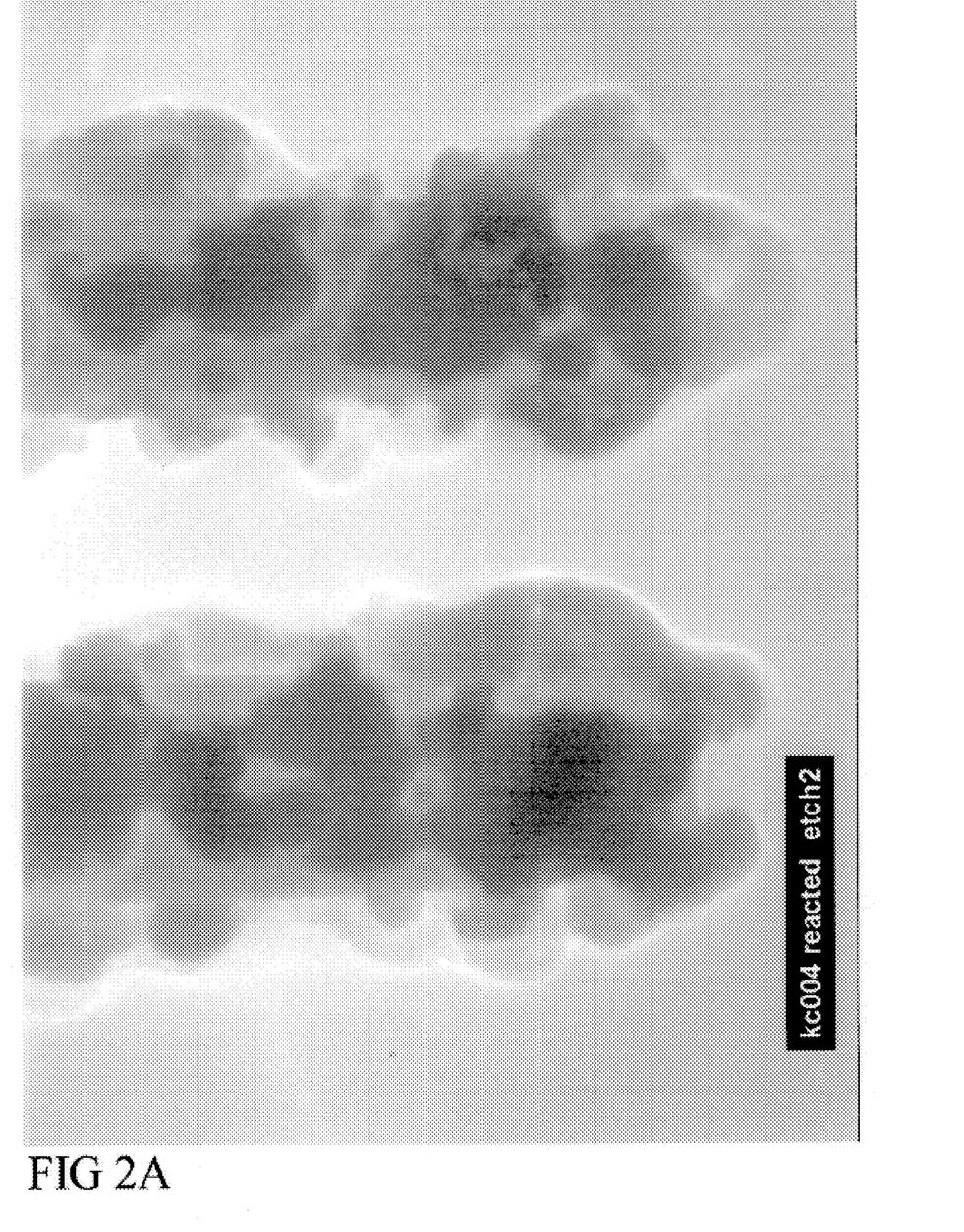
FIGS. 2A–B are scanning electron micrographs of semiconductor structure comprising trenches having roughened interior sidewalls that are prepared using $CoSi_2$ as the roughening agent; 2A is bottom portion of the roughened trenches, whereas 2B illustrates the same roughened trenches, halfway up the sidewall from the bottom wall.
Figure 2B:
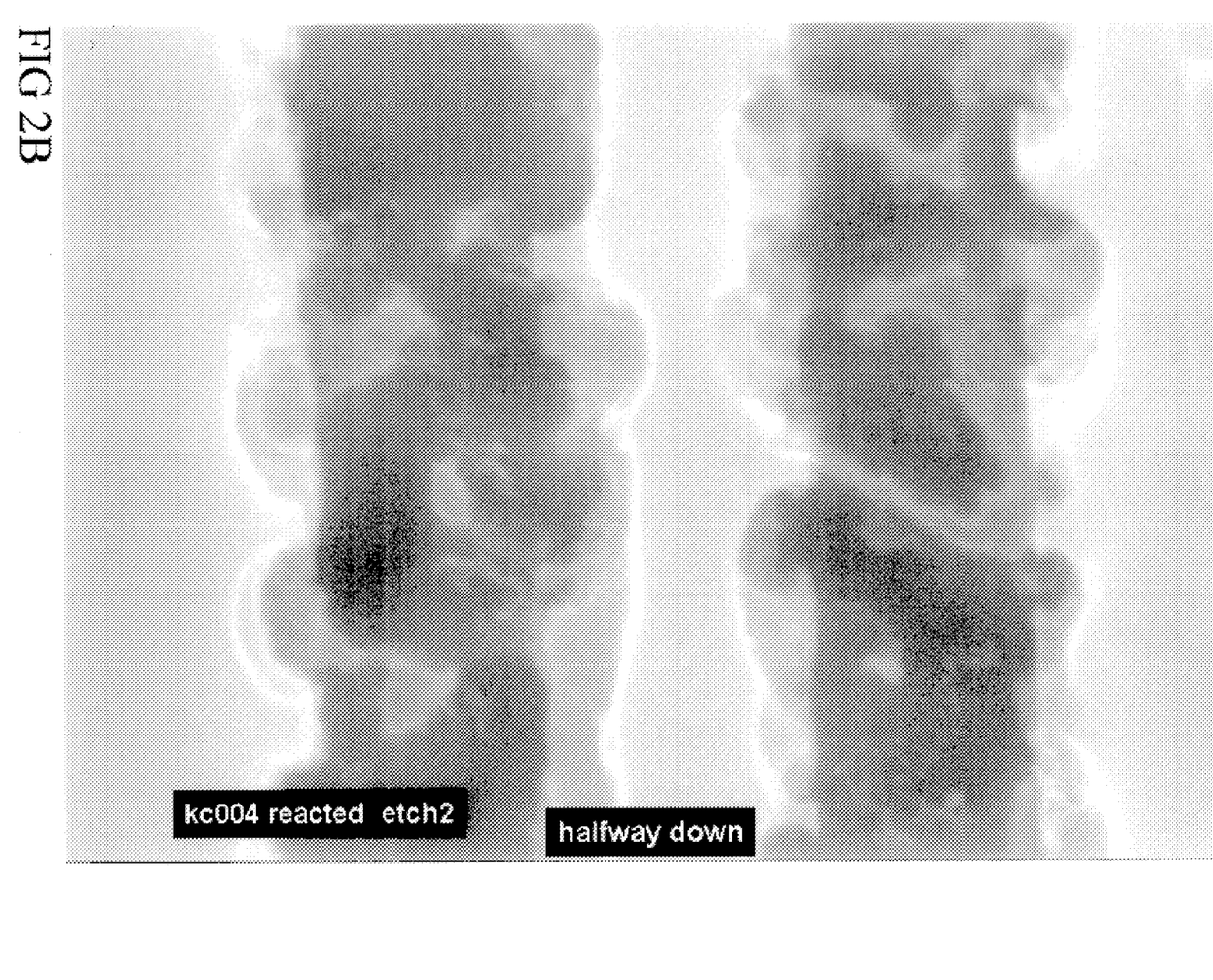

Next, and as illustrated in FIG. 1F, metal silicide layer 28 is removed utilizing an etching process that is highly selective to Si. Specifically, any wet etching process which can remove metal silicide selectively can be employed in the present invention. Although various chemical etchants can be employed, HF is preferred in the present invention for selectively removing the metal silicide layer from the structure. Note that in FIG. 1F, the trench walls are now roughened. The roughened trench walls are labeled as 30 in FIG. 1F. A scanning electron micrograph of trenches having roughened interior trench walls is shown, for example, in FIGS. 2A–2B.

The roughening of the interior trench walls is achieved in the present invention due to the following two reasons:
(1) The metal deposition may, in one embodiment, consist of grains that appear as lumps, See FIG. 1D. When the metal is reacted with the Si trench wall to form silicide, more Si is consumed in the lump. Thus, the lumpy structure of the metal film is transferred onto the silicon trench wall. Moreover, in the case of $CoSi_2$ every nanometer of metal would consume about 3.6 nanometer of Si, thus the lumpy film structure is magnified when transferred to the trench walls.
(2) Many silicides would form a wavy interface, even if the initial metal film is a continuous flat layer. This is particularly characteristic of tungsten silicide.

A crude estimation of trench wall surface enhancement can be obtained as follows: If every reacted metal lump is assumed to form a half sphere of silicide having a base radius R, then every portion of the trench wall of area $pi*R^2$ is converted into a half sphere with a surface area $2*pi*R^2$, following the silicide etch. The increase in the surface area is a factor of two. The total increase in the trench surface area may be smaller since it depends on the metal lump coverage, i.e., density.

Figure 1G:
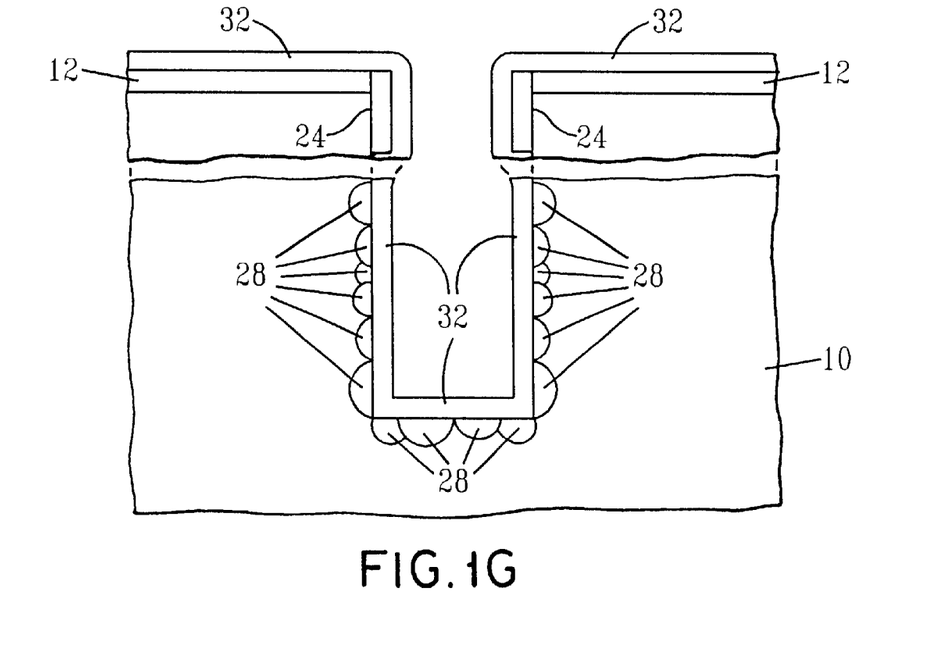
Figure 1H:
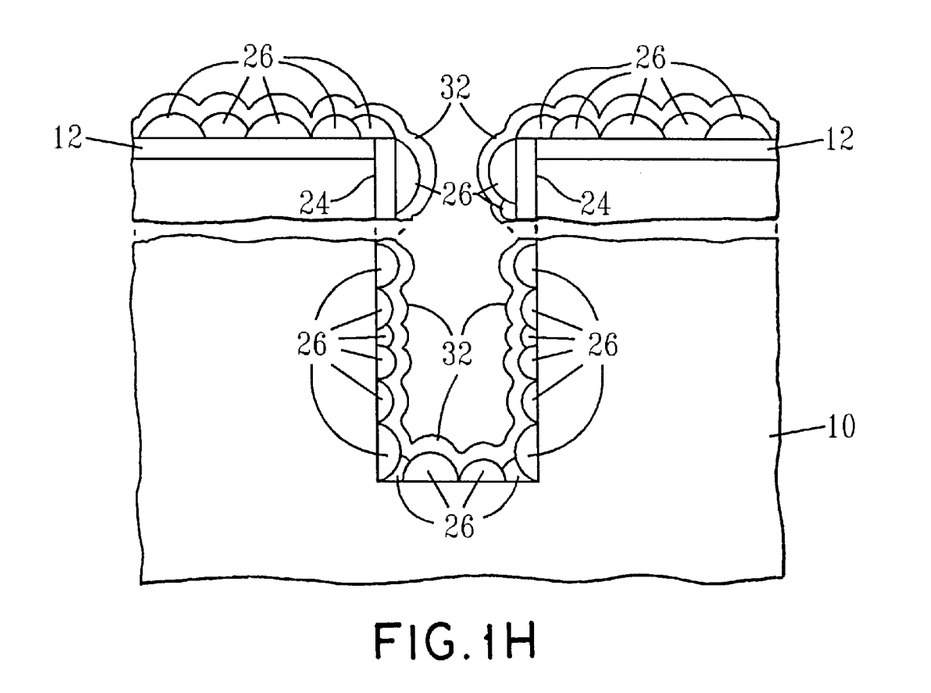

The above process consumes a portion of the trench wall, and thus makes the trench wider. A wider trench is not desirable in some instances as it may reduce the capacitor layout density. Furthermore, in the case of closely packed capacitors, widening of the trench may risk the shorting of two adjacent trenches during silicidation. Restoring the trench to its original width may be achieved in the present invention by depositing Si-containing layer 32 onto the trench containing metal silicide layer 28. This optional embodiment is shown in FIG. 1G, for example.

The deposition may be epitaxial or non-epitaxial (such as amorphous Si, polysilicon, SiGe, SiC deposition). In the later case, the Si can be diffused and recrystallized by a annealing step which is carried out after silicidation in an inert gas atmosphere such as He, Ar, $N_2$, Xe, Kr, Ne and mixtures thereof at a temperature of about 700° C. or above for a time period of from about 60 seconds or greater. More preferably, the anneal used in diffusing and recrystallizing the Si-containing layer is from about 750° to about 900° C. for a time period of from about 60 to about 240 seconds. The silicide (at the surface) is etched as described earlier.

In yet another embodiment of the present, Si-containing layer 32 is formed atop metal layer 26 prior to annealing; See the structure shown, for example in FIG. 1H. Note that in this structure a conformal Si-containing layer, i.e., a Si-containing layer that follows the contour of the underlying surface, is employed. Although a conformal layer is shown, the present invention also contemplates planarizing Si-containing layers. Si-containing layer 32 caps metal 26 and sandwiches it between two Si-containing layers. When the structure is annealed to form the silicide, the metal reacts with both Si-containing interfaces. The silicide would also form in the deposited Si-containing layer; therefore the total consumption of the silicon from the trench would be reduced. Note that when such an embodiment is employed, any unreacted Si-containing layer is removed following annealing utilizing a wet etch process that is highly selective to Si. For example TMAH (trimethylammonium hydroxide) could be used as the chemical etchant. Following removal of the unreacted Si-containing layer, the silicide is removed as described hereinabove.

Figure 3A:
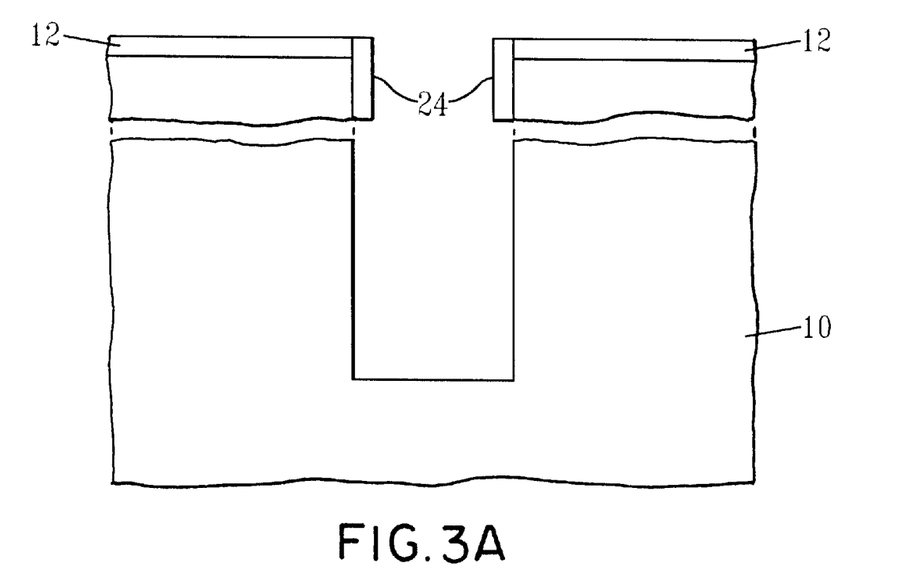
FIGS. 3A–3E are pictorial representations (through cross-sectional views) illustrating an optional embodiment employed in the present invention in forming roughened trench sidewalls wherein SiGe islands are formed in the trench prior to deposition of a lumpy metal layer.

An alternative method that can be used in roughening the trench walls is also shown in FIGS. 3A–3E. Specifically, FIG. 3A shows a structure comprising Si-containing substrate 10, hardmask 12 and at least one trench opening 14 formed through the hardmask and the Si-containing substrate. The structure shown in FIG. 3A is fabricated utilizing the processing steps mentioned hereinabove. After forming the structure shown in FIG. 3A, silicon germanium, SiGe, islands 34 or other like material in which the metal is insoluble in is formed on the interior trench walls using an epitaxial deposition process; See FIG. 3B. The surface density and size of the SiGe islands is controlled by the deposition temperature and growth time and the Ge concentration.

Figure 3B:
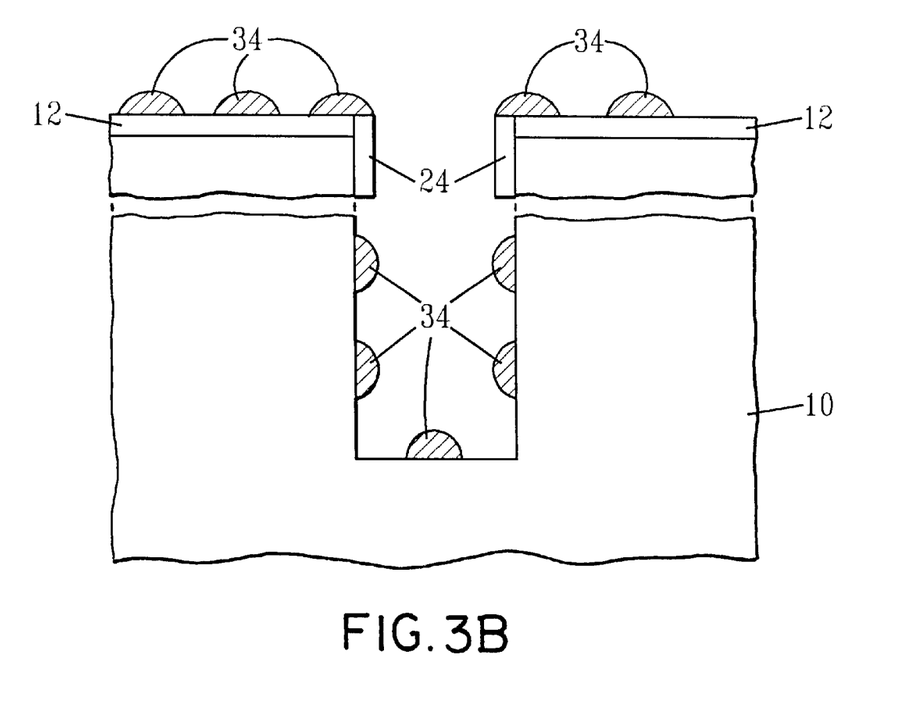
Figure 3C:
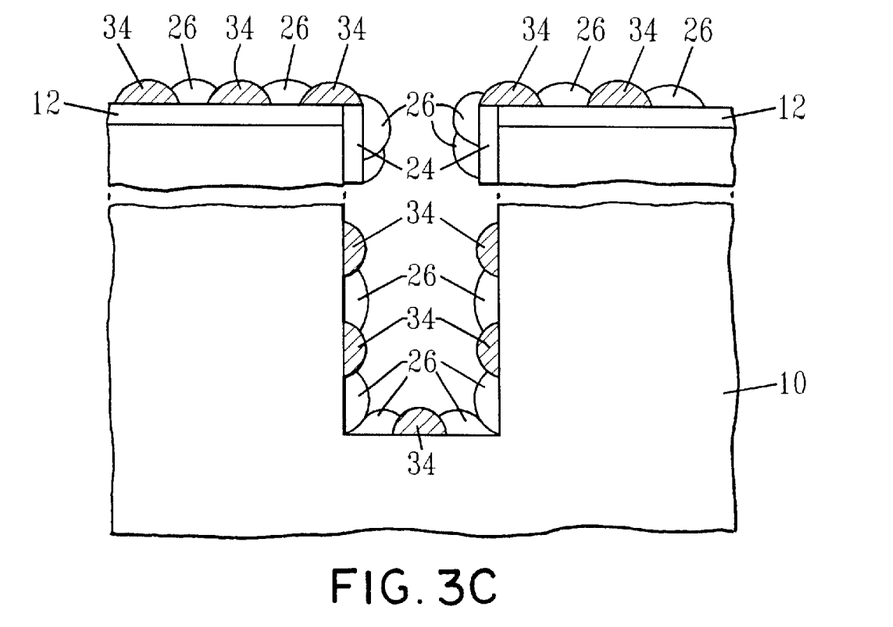

The SiGe islands employed in the present invention contain Ge in an amount of from about 3 to about 100%, with a Ge content of from about 30 to about 100% being more highly preferred. In a most preferred embodiment, the SiGe islands are pure Ge islands containing 100% Ge and 0% Si.

Following the formation of the SiGe islands, metal layer 26 is formed as described above providing the structure shown in FIG. 3C. Note that in FIG. 3C, the structure includes alternating SiGe islands and alternating metal islands. In one embodiment which is not shown, metal islands may be formed atop the SiGe islands as well as between the islands. During subsequent annealing the metal atop of the islands does not form a metal silicide since the metal is insoluble in the islands.

Figure 3D:
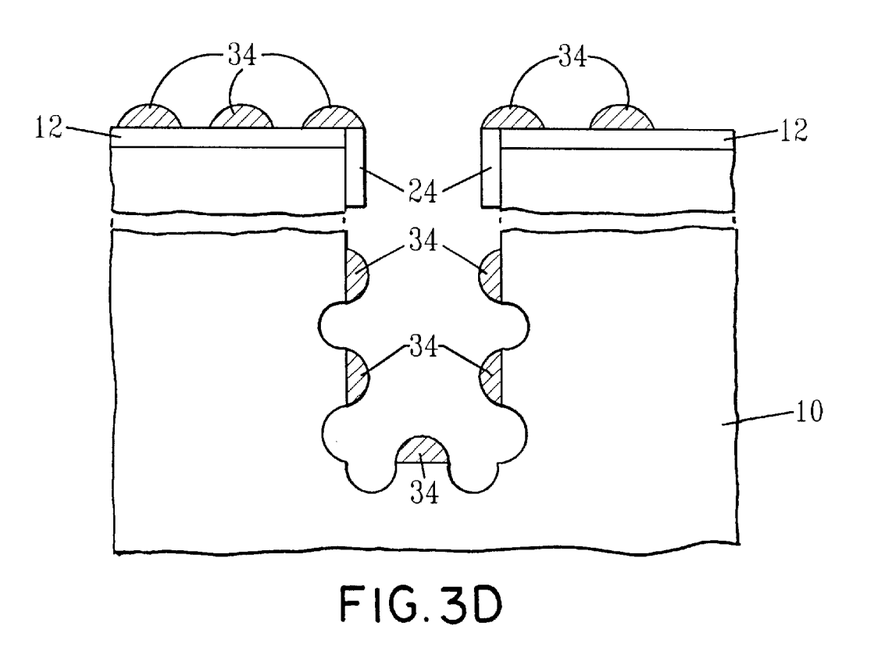

The structure is then annealed as described above so as to form silicide layer 28, and any unreacted metal and silicide layer is removed utilizing the etching processes mentioned above so as to provide the structure shown, for example, in FIG. 3D. Since the metal is insoluble in SiGe, those regions of the trench walls masked by SiGe islands will not react with the metal.

Figure 3E:
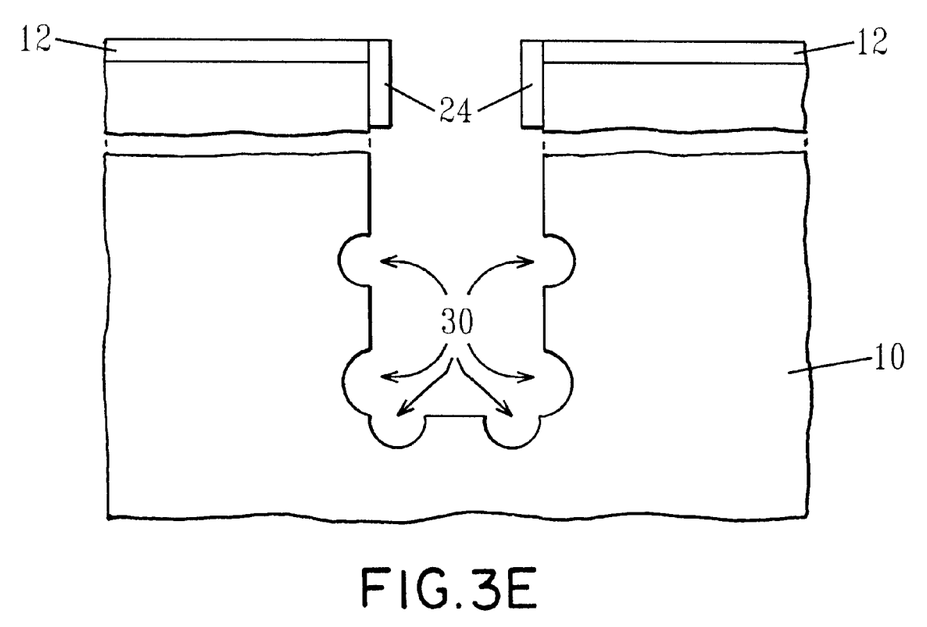

The SiGe islands are thereafter removed from the structure utilizing a selective wet etch process that is selective with respect to Si. For example, an aqueous peroxide mixture can be employed in selectively removing the SiGe islands from the trench walls. The resultant structure after removing the SiGe islands is shown in FIG. 3E.

Figure 4A:
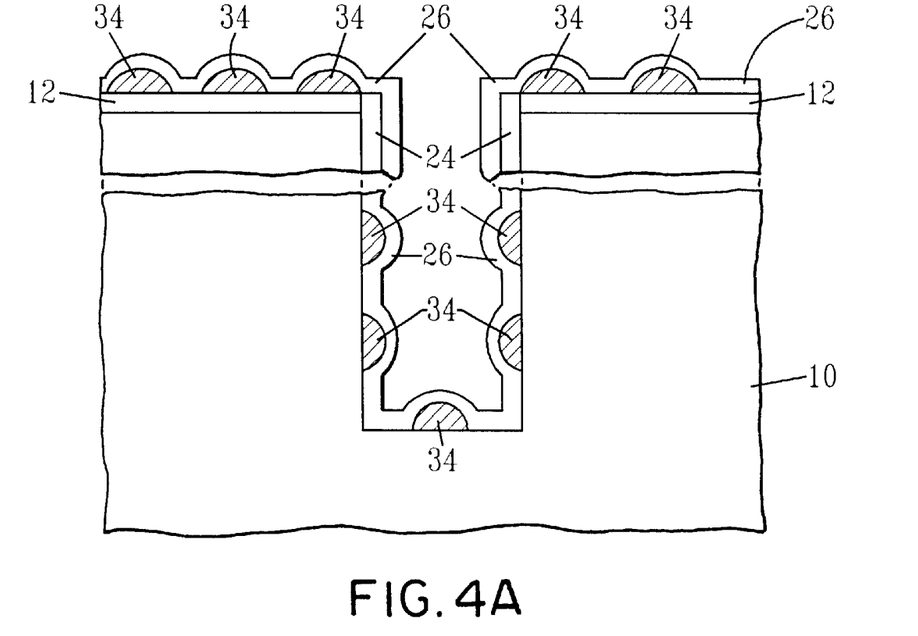
FIGS. 4A–4B are pictorial representations (through cross-sectional views) illustrating another optional embodiment employed in the present invention in forming roughened trench sidewalls wherein SiGe islands are formed in the trench prior to deposition of a smooth and continuous metal layer.
Figure 4B:
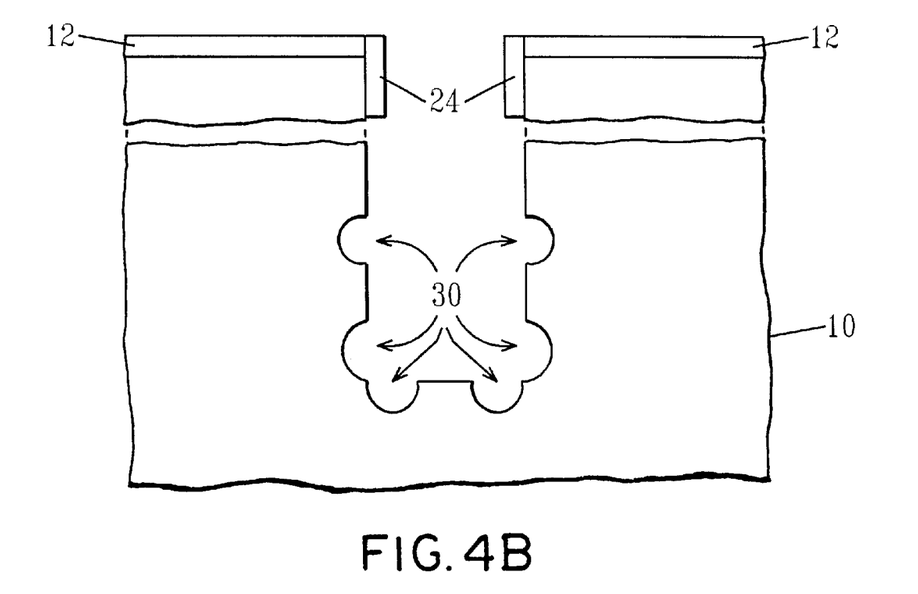

FIGS. 4A–4B shows an embodiment of the present invention wherein SiGe islands 34 and continuous and uniform metal layer 26 are employed. FIG. 4A is prior to annealing, FIG. 4B is after annealing and etching.

Figure 5:
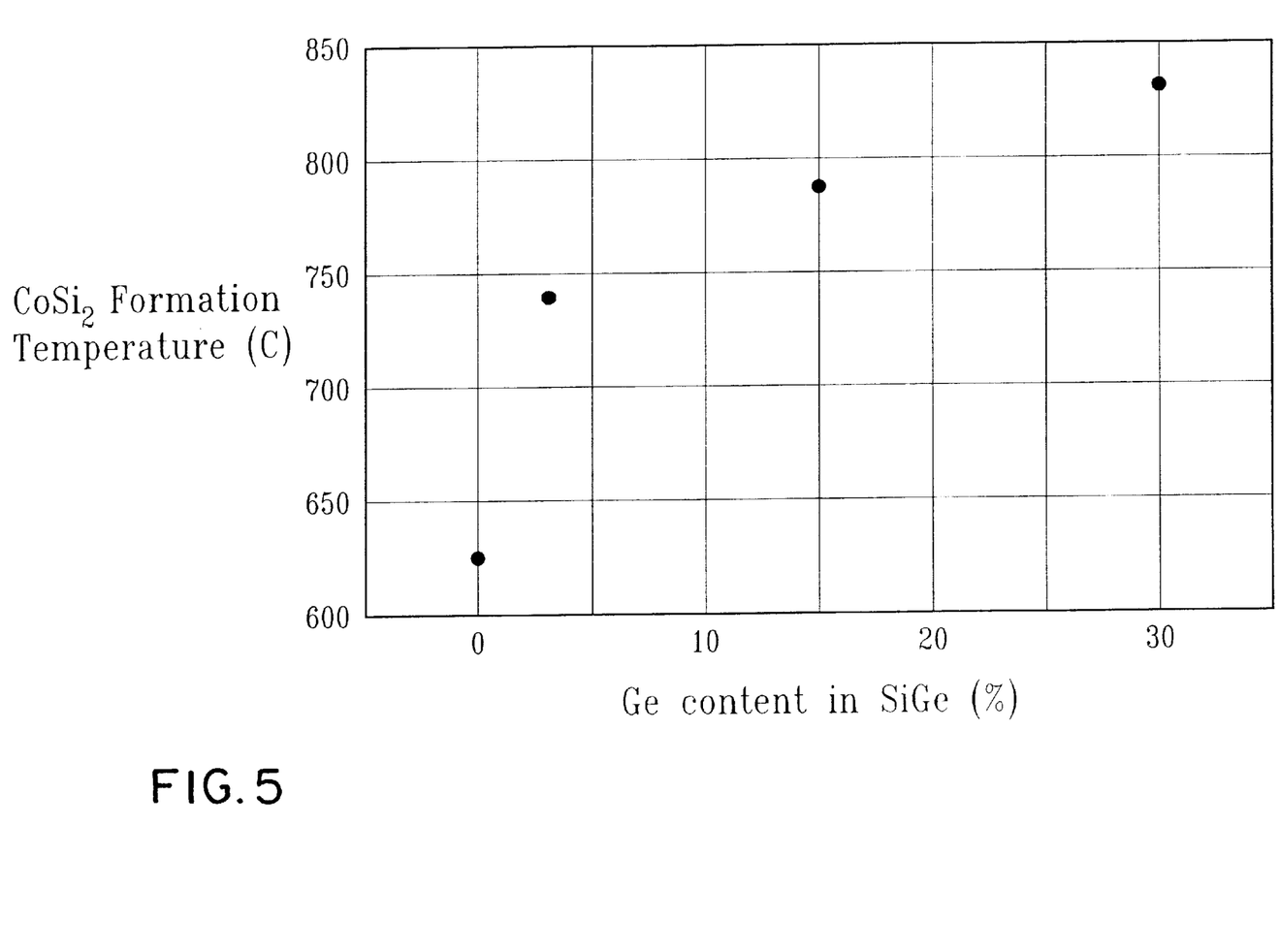
FIG. 5 is a plot of $CoSi_2$ formation temperature (° C.) vs. Ge content in SiGe (atomic %).

FIG. 5 shows a graph of CoSi$_2$ formation temperature (° C.) vs. Ge content in SiGe (atomic %). The plot shows that the temperature of CoSi$_2$ formation is directly proportional to the content of Ge in the SiGe islands Note that for higher Ge content, the formation temperature is higher. CoSi$_2$ will not form over SiGe islands if the anneal is carried out at a temperature which lowers the formation temperature of the silicide in the SiGe.

It is also possible to use the SiGe islands as a mask, without the silicide process, and etch the exposed silicon walls with an etchant which is selective to SiGe. Although such a possibility exists, the etch is basically a timed etch and does not have the property of being self-limited, as is the case of the silicide.

Note that the SiGe island embodiment also contemplates the formation of a Si-containing layer on the structure either after silicide formation or prior to silicide formation, as was previously described in respect to the non-SiGe island embodiment.

In conclusion, the present invention provides a method for increasing the trench capacitor surface area. The inventive method, which utilizes a metal silicide to roughen the trench walls, increases capacitance due to the increase in the trench surface area after the silicide has been removed. The roughening of the trench walls can be controlled by varying one or more of the following parameters: the density of the metal islands, the metal film thickness, the silicide phase, and the choice of the metal. Once the metal is deposited in the trench, the inventive process is self-limited. Shrinking the trench to its original width can be obtained by subsequent silicon deposition or by diffusion of silicon from a cap layer through the silicide.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of increasing the surface area of a trench comprising the steps of:
   (a) forming a trench in a Si-containing substrate, said trench having a upper region, a lower region and bare interior walls including sidewalls which extend to a common bottom wall;
   (b) forming a metal layer on at least a portion of the bare interior walls of said trench;
   (c) annealing said metal layer so as to form a metal silicide layer; and
   (d) removing said metal silicide layer to provide roughened trench walls.

2. The method of claim 1 wherein said trench is formed by lithography and etching.

3. The method of claim 1 wherein said Si-containing substrate comprises a Si semiconductor material selected from the group consisting of Si, SiGe, SiGeC, SiC, Si/Si, Si/SiGe and silicon-on-insulators.

4. The method of claim 5 wherein said collar region is formed by deposition of at least one dielectric material.

5. The method of claim 1 further comprising forming a collar region in said upper region of said trench prior to forming said metal layer.

6. The method of claim 1 further comprising a step of removing a native oxide layer that is formed in said trench during step (a).

7. The method of claim 6 wherein said native oxide layer is removed with HF.

8. The method of claim 1 wherein said metal layer is comprised of an elemental metal selected from the group consisting of Ti, Co, Ni, W, Mo, Pt, Nb, Ta, V, Zr, Hf and mixtures thereof.

9. The method of claim 8 wherein said elemental metal further includes an alloying additive, said alloying additive is selected from the group consisting of Si, Sc, Ti, V, Cr, Ge, Mn, Fe, Ni, Cu, Y, Zr, Nb, Rh, In, Sn, La, Hf, Ta, W, Re, Pt, Ce, Pr, Nd, Sm, Eu, Gd, Tb, Dy, Ho, Er, Tm, Yb and any combination thereof, with the proviso that the alloying additive is not the same element as the elemental metal.

10. The method of claim 9 wherein said alloying additive is employed in an amount of from about 0.01 to about 50 atomic percent.

11. The method of claim 1 wherein said metal layer is a continuous and uniform metal layer or a layer that is comprised of islands.

12. The method of claim 11 wherein said continuous and uniform metal layer has a thickness of from about 1 to about 200 nm.

13. The method of claim 11 wherein said islands cover an area of from about 5×5 to about 2000×2000 nm and has a height of from about 5 to about 100 nm.

14. The method of claim 11 wherein said islands have a density of from about $10^9$ to about $10^{15}$ cm$^{-2}$.

15. The method of claim 1 wherein said metal layer is comprised of Co islands.

16. The method of claim 1 wherein said metal is formed by a selective or non-selective deposition process.

17. The method of claim 1 wherein said metal is formed by a conformal deposition process.

18. The method of claim 1 wherein said annealing step is carried out by a rapid thermal annealing process.

19. The method of claim 18 wherein said rapid thermal annealing process is carried out at a temperature of about 300° C. or above for a time period of from about 300 seconds or less.

20. The method of claim 19 wherein said metal is Co and said rapid thermal annealing process is carried out at a temperature of about 550° C. or above for a time period of about 120 second or less.

21. The method of claim 1 further comprising removing any non-reacted metal after step (c) but prior to step (d).

22. The method of claim 21 wherein said non-reacted metal is removed using a wet etch process wherein a chemical etchant that has a high selectivity to non-reacted metal as compared with metal silicide employed.

23. The method of claim 22 wherein said chemical etchant comprises a mixture of hydrogen peroxide and nitric or sulfuric acid.

24. The method of claim 1 wherein said metal silicide layer is removed by a wet etch process wherein a chemical etchant that has a high selectivity to metal silicide as compared with Si is employed.

25. The method of claim 24 wherein said chemical etchant is HF.

26. A method of increasing the surface area of a trench, without widening the dimension of the trench, said method comprising the steps of:
   (a) forming a trench in a Si-containing substrate, said trench having an upper region, a lower region and interior walls including sidewalls which extend to a common bottom wall;

(b) forming a collar region in said upper region of said trench;

(c) forming a metal layer on at least a portion of exposed interior walls of said trench;

(d) forming a Si-containing layer on said metal layer;

(e) annealing said metal layer so as to form a metal silicide layer; and (f) removing said metal silicide layer so as to provide roughened trench walls.

27. The method of claim 26 wherein said Si-containing layer comprises amorphous Si, SiGe, SiC, polysilicon or epitaxial Si.

28. A method of increasing the surface area of a trench, without widening the dimension of the trench, said method comprising the steps of:

(a) forming a trench in a Si-containing substrate, said trench having an upper region, a lower region and interior walls including sidewalls which extend to a common bottom wall;

(b) forming a collar region in said upper region of said trench;

(c) forming a metal layer on at least a portion of exposed interior walls of said trench;

(d) annealing said metal layer so as to form a metal silicide layer;

(e) forming a Si-containing layer on said metal layer and annealing said Si-containing layer so as to diffuse said Si-containing layer through said metal silicide layer; and (f) removing said metal silicide layer so as to provide roughened trench walls.

29. The method of claim 28 wherein said Si-containing layer comprises amorphous Si, SiGe, SiC, polysilicon or epitaxial Si.

30. The method of claim 28 wherein said annealing of step (e) is carried out in an inert gas at a temperature of about 700° C. or greater for a time period of about 60 seconds or greater.

31. The method of claim 30 wherein said annealing of step (e) is carried out at a temperature of from about 750° to about 900° C. for a time period of from about 60 to about 240 seconds.

32. A method of increasing the surface area of a trench said method comprising the steps of:

(a) forming a trench in a Si-containing substrate, said trench having an upper region, a lower region and interior walls including sidewalls which extend to a common bottom wall;

(b) forming a collar region in said upper region of said trench;

(c) forming SiGe islands in at least said lower region of said trench, (d) forming a metal layer on at least a portion of exposed interior walls of said trench not containing said SiGe islands;

(e) annealing said metal layer so as to form a metal silicide layer; and (f) removing said metal silicide layer and said SiGe islands so as to provide roughened trench walls.

33. The method of claim 32 wherein said SiGe islands are formed by an epitaxial deposition process.

34. The method of claim 32 wherein said SiGe islands are removed utilizing a selective wet etch process.

35. The method of claim 32 wherein said SiGe islands comprise from about 3 to about 100% Ge.

36. The method of claim 35 wherein said SiGe islands comprise from about 30 to about 100% Ge.

37. The method of claim 32 wherein said SiGe islands are replaced with pure Ge islands.

38. The method of claim 32 wherein said metal layer is continuous and uniform or non-continuous and lumpy.

* * * * *